United States Patent
Van Veldhoven et al.

(10) Patent No.: US 10,284,220 B1
(45) Date of Patent: May 7, 2019

(54) EQUALIZATION CIRCUIT, A METHOD OF OPERATING AN EQUALIZATION CIRCUIT AND A SYSTEM COMPRISING AN EQUALIZATION CIRCUIT AND AN ADC

(71) Applicant: NXP B.V., Eindhoven (NL)

(72) Inventors: Robert Van Veldhoven, Valkenswaard (NL); Alphons Litjes, Zijtaart (NL); Erik Olieman, Waalre (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/122,637

(22) Filed: Sep. 5, 2018

(30) Foreign Application Priority Data

Nov. 20, 2017 (EP) .................................. 17202502

(51) Int. Cl.
G05F 1/10 (2006.01)
H03M 1/06 (2006.01)
H03M 1/12 (2006.01)
H03M 1/36 (2006.01)
H03M 1/46 (2006.01)

(52) U.S. Cl.
CPC ......... *H03M 1/468* (2013.01); *H03M 1/0697* (2013.01); *H03M 1/1255* (2013.01); *H03M 1/365* (2013.01); *G05F 1/10* (2013.01)

(58) Field of Classification Search
CPC .... H03M 1/468; H03M 1/0697; H03M 1/365; H03M 1/1255; G05F 1/10
USPC ................................................... 341/155, 172
See application file for complete search history.

(56) References Cited

U.S. PATENT DOCUMENTS

| | | | |
|---|---|---|---|
| 7,936,296 B2* | 5/2011 | Kibune | H03M 1/108 341/155 |
| 9,223,332 B1 | 12/2015 | Himmelbauer et al. | |
| 9,473,165 B2 | 10/2016 | Mirhaj et al. | |
| 9,509,327 B2* | 11/2016 | Kibune | H03M 1/1057 |

OTHER PUBLICATIONS

Elumalai, Iniyavan, "A Capacitance-Based Reference Scheme for a 14b-Linear, 100 MS/s SAR-Assisted Pipeline ADC," Master of Science Thesis, Delft University of Technology, Aug. 21, 2012, Retrieved from internet https://repository.tudelft.nl/islandora/object/uuid%3A8b94e22b-cd51-407c-af86-9c2389f20e4c Jul. 16, 2018, 102 pages.

* cited by examiner

*Primary Examiner* — Khai M Nguyen (57) ABSTRACT

The present application relates to an EQ circuit, a method of operating it and a system comprising the EQ circuit and an ADC. The EQ circuit has a configurable load section, which is provided for selectively exposing one of a plurality of distinct loads to a reference source connected to a reference voltage signal input of the equalization circuit, and a logic section, which is arranged to accept a state signal from the ADC and to selectively connect one distinct load out of the plurality of distinct loads in response to the state signal. The state signal is indicative of an actual operation state of the ADC.

20 Claims, 5 Drawing Sheets

EQUALIZATION CIRCUIT, A METHOD OF OPERATING AN EQUALIZATION CIRCUIT AND A SYSTEM COMPRISING AN EQUALIZATION CIRCUIT AND AN ADC

CROSS-REFERENCE TO RELATED APPLICATIONS

This application claims priority under 35 U.S.C. § 119 to European patent application no. EP 17202502.5, filed Nov. 20, 2017, the contents of which are incorporated by reference herein.

FIELD OF THE INVENTION

The present disclosure relates to an analog-to-digital converter (ADC), in particular to a successive approximation register (SAR) ADC and more particularly, to a charge redistribution (CR) SAR ADC.

BACKGROUND

An ADC is a device, which converts an analog input signal into digital output data. The ADC samples the analog input signal and converts the sampled analog input signal into digital data. Among ADCs, a SAR ADC approximates the sampled input by sequentially increasing or decreasing its internal generated reference, starting with the most significant bit. A typical SAR ADC includes an N-bit (where N is an integer equal to or greater than 1) Digital-to-Analog Converter (DAC), a sample and hold, a comparator and a SAR logic core. The N-bit DAC converts an N-bit digital data into a corresponding reference voltage. The comparator compares the analog voltage generated from the N-bit DAC with the sampled analog input signal. If the analog input signal is greater than the reference voltage, the comparator generates a high-level signal, e.g. a signal having a logic value of 1. If the analog voltage is greater than the analog input signal, the comparator generates a low-level signal, e.g. a signal having a logic value of 0.

When setting the Most Significant Bit (MSB) of the digital data input of the N-bit DAC to a logic value of 1, and comparing the analog input signal with the reference voltage generated from the N-bit DAC, the MSB of the N-bit digital data can be determined. Next, the above-described comparison process is repeated for the remaining bits by sequentially changing a subsequent bit of the digital data input of the N-bit DAC to determine the N-bit digital data corresponding to the analog input signal.

One of the most common implementations of the SAR ADC, the charge-redistribution SAR ADC, uses a charge scaling DAC. The charge scaling DAC includes a capacitor array of individually switched weighted capacitors. The successive approximation and the DAC is used to perform a, often binary, search by selectively switching an amount of charge upon each capacitor in the array based on a comparator and the successive approximation register.

The search requires charging and/or discharging of one or more capacitors of the capacitor array at each iteration with a charge, which dependents on the state of the capacitors in the array and the decision made by the comparator. Accordingly, a state dependent current is drawn by the capacitor array from the source supplying the reference voltage signal.

This DAC switching causes a charge-redistribution SAR ADC to draw input signal/output data dependent current from the reference voltage source. The output impedance of the reference voltage source has to be adapted to the varying currents drawn by the charge-redistribution SAR ADC since the voltage stability of the reference voltage source is crucial for the accuracy of the charge-redistribution SAR ADC.

SUMMARY

The present invention provides an equalization circuit, a method of operation an equalization circuit and a system comprising an equalization circuit and an ADC as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION

Embodiments of the present disclosure will be described below in detail with reference to drawings. Note that the same reference numerals are used to represent identical or equivalent elements in figures, and the description thereof will not be repeated. The embodiments set forth below represent the necessary information to enable those skilled in the art to practice the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
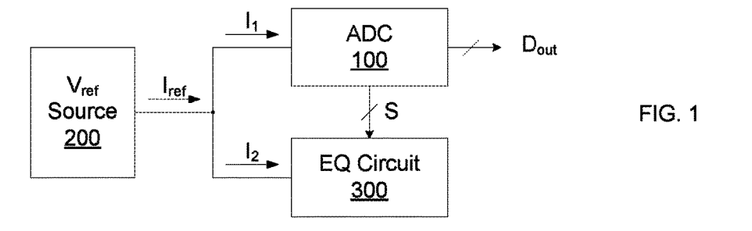
FIG. 1 schematically illustrates a block diagram of an exemplary analog-to-digital converter (ADC) and equalization, EQ, circuit according to an embodiment of the present application.

Referring now to FIG. 1, schematically illustrates a block diagram of an analog-to-digital converter (ADC) 100, which is connected to a reference source 200 supplying a reference voltage signal $V_{ref}$ to the ADC 100. The ADC 100 is provided to sample an analog input signal $V_{in}$ input to the ADC 100 and to convert the sampled analog input signal $V_{in}$ into digital data signal $D_{out}$, which codes a value representative of the magnitude of the sampled analog input signal $V_{in}$. The reference voltage signal $V_{ref}$ supplied by the source 200 is the reference base value, with respect to which the sampled analog input signal $V_{in}$ is converted into the digital data signal $D_{out}$.

Figure 2:
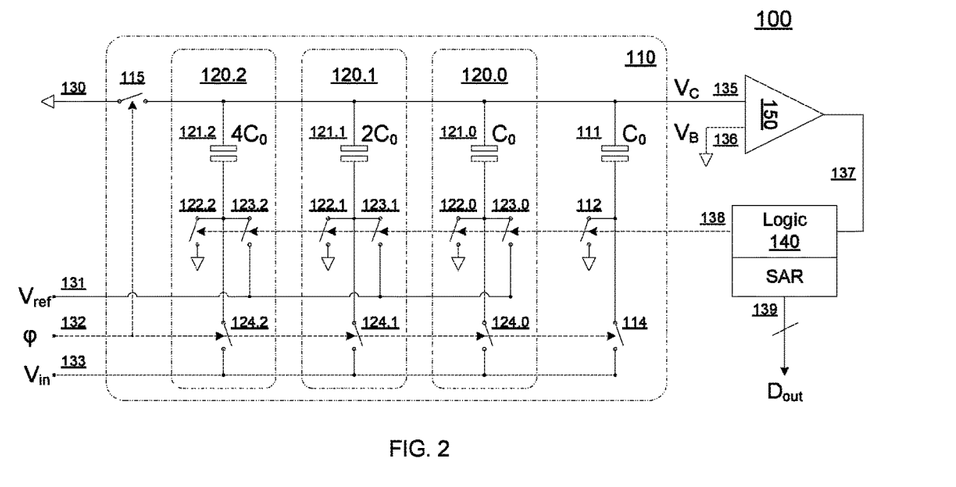
FIG. 2 schematically illustrates a block diagram of an exemplary charge redistribution (CR) successive approximation register (SAR) ADC.

Referring now to FIG. 2, schematically illustrates a block diagram of a charge redistribution (CR) SAR ADC according to an example of the present application. The schematically illustrated CR SAR ADC is an example of the aforementioned ADC 100.

The example CR SAR ADC is illustratively shown as a 3-Bit CR SAR ADC having a capacitor array 110 with capacitor stages 120.2 to 120.0, each comprising one of the binary weighted capacitors. The capacitor array of the exemplified 3-Bit CR SAR ADC comprises the binary weighted capacitors 121.2 to 121.0 with capacitances corresponding to respective capacitance scaling factors 4, 2, and 1 (corresponding to $2^{N-1}$, $2^{N-2}$ ..., $2^0$; wherein N is the bit resolution of the ADC, herein N=3) with respect to a base capacitance $C_0$. The capacitor array comprises an additional capacitor 111, which has a capacitance corresponding to the lowest capacitance of the binary weighted capacitors, herein corresponding to respective capacitance scaling factor 1 (corresponding to $2^0$) with respect to the base capacitance $C_0$. The total capacitance of the capacitor array 110 is $2^N \cdot C_0$.

Each of the binary weighted capacitors 121.2 to 121.0 is individually and selectively connectable to a node 131, to which the reference voltage signal $V_{ref}$ is applied, to a node 133, to which the analog input signal $V_{in}$ is applied, and a base potential $V_B$, e.g. ground, by operating switches 122.2-0, 123.2-0, and 124.2-0 of the respective capacitor stage 120.2 to 120.0. The additional capacitor 111 is individually and selectively connectable to the node 133, to which the analog input signal $V_{in}$ is applied, and to the base potential $V_B$, e.g. ground, by using switch 114. For the sake of understanding, it should be noted that the exemplified switches are single pole switches, which are in open state (non-connecting state) by default.

The capacitors of the capacitor array 110 are arranged in a bank circuitry. One plate, e.g. the bottom plate, of each of the capacitors 121.2-0 and 112, is selectively and individually connectable to the reference voltage signal $V_{ref}$, the analog input signal $V_{in}$, or the base potential $V_B$. The other plates, e.g. the top plates, of the capacitors 121.2-0 and 112, are interconnected with each other at node 135, to a comparator 150 and selectively to the base potential $V_B$ at node 130.

The comparator 150 is configured to compare, at a first input thereof, a bank voltage signal $V_C$ at the node 135 with the base potential $V_B$ applied at node 136 and connected to the comparator 150 at a second input thereof.

The comparator outputs a comparison signal 137 to a logic 140. The comparison signal 137 is indicative of whether the bank voltage signal $V_C$ is greater or smaller than the base potential $V_B$. The logic 140 is configured to selectively operate the switches 122.2-0, 123.2 and 112 in accordance with the successive approximation of the analog input signal $V_{in}$. The logic 140 may comprise a finite state machine (not shown) for performing the successive approximation procedure. The logic 140 comprises a successive approximation register for holding the digital data signal $D_{out}=D_{out}[N-1:0]$, where N is the bit resolution of the CR SAR ADC.

In a first phase, the reset phase, the capacitors of the capacitor array 110 are completely discharged to the base potential $V_B$, which is herein the offset voltage of the comparator 150. Herein, the capacitors are connected to the base potential $V_B$ by operating the switches 122.2-0, 112, and 115 into closed states (connecting states).

In a second phase, the sampling phase, all capacitors within the capacitor array 110 are switched to the analog input signal $V_{in}$. Herein, the capacitors are connected to the node 133, at which the analog input signal $V_{in}$ is present, by operating the switches 124.2-0 and 114 into closed states in response to a sampling signal φ input at node 132. Further, the switch 115 is operated into closed states in response to an asserted sampling signal φ such that all capacitors within the capacitor array 110 are further connected to the base potential $V_B$ at the node 130. The capacitors now have a charge corresponding to their respective capacitance times the input voltage minus the base potential $V_B$ upon each of them. The sampling phase is completed on operating the switches 124.2-0, 114 and 115 back into open state in response to a deasserted (released) sampling signal φ.

After the sampling phase, the charge of the capacitors 121.2-0 and 111 creates a bank voltage signal $V_C=-V_{in}$, which is applied across the first input of the comparator 150.

In the third phase, the conversion phase, the successive approximation is performed under control of the logic 140. At an initial stage of the conversion phase, all capacitors within the capacitor array 110 are connected to the base potential $V_B$ by operating the switches 123.2-0 and 112.

In the following, the successive approximation process is briefly summarized with respect to the exemplary CR SAR ADC of FIG. 2. The various switching states of the capacitor array is illustratively shown in FIG. 4 for the sake of understanding.

In a first cycle, the MSB cycle, the MSB capacitor 121.2 ($4 \cdot C_0$), which is the capacitor with the largest capacitance $2^{N-1} \cdot C_0$ (where N is the bit resolution), is switched to the reference voltage signal $V_{REF}$ at the node 131 by operating the switch 123.2 into closed state and the switch 122.2 into open state. The bank voltage signal $V_C$ to the comparator 150 is $V_C=-V_{in}+\frac{1}{2}V_{ref}$. If the bank voltage signal $V_C$ is greater than the base potential $V_B$, $V_C>V_B$, then the comparator 150 generates a comparison signal indicative of a logic 0 as the MSB. The MSB capacitor 121.2 ($4 \cdot C_0$) is switched back to the base potential $V_B$. If otherwise the bank voltage signal $V_C$ is smaller than the base potential $V_B$, ($V_C<V_B$), the comparator 150 generates a comparison signal indicative of a logic 1 as the MSB of the digital data signal $D_{out}[N-1]$. The MSB capacitor 121.2 ($4 \cdot C_0$) remains connected to the reference voltage signal $V_{ref}$.

In a second cycle, the MSB-1 cycle, the MSB-1 capacitor 121.1 ($2 \cdot C$), which is the capacitor with the second largest capacitance $2^{N-2} \cdot C_0$ (where N is the bit resolution), is switched to the reference voltage signal $V_{REF}$ at the node 131 by operating the switch 123.1 into closed state and the switch 122.1 into open state. The bank voltage signal $V_C$ to the comparator is $V_C=-V_{in}+\frac{1}{4}V_{ref}$ or $V_C=-V_{in}+\frac{3}{4}V_{ref}$ depending of the MSB has been determined to logic 0 or to logic 1. If the bank voltage signal $V_C$ is greater than the base potential $V_B$, $V_C>V_B$, then the comparator 150 generates a comparison signal indicative of a logic 0 as the MSB-1. The MSB-1 capacitor 121.1 ($2 \cdot C_0$) is switched back to the base potential $V_B$. If otherwise the bank voltage signal $V_C$ is smaller than the base potential $V_B$, ($V_C<V_B$), the comparator 150 generates a comparison signal indicative of a logic 1 as the MSB-1 of the digital data signal $D_{out}$[N-2]. The MSB capacitor 121.1 (2·$C_0$) remains connected to the reference voltage signal $V_{ref}$.

In a third cycle the MSB-2, the MSB-2 capacitor 121.0 ($C_0$), which is the capacitor with the third largest capacitance $2^{N-3} \cdot C_0$ and herein with the smallest capacitance $C_0$, is switched to the reference voltage signal $V_{REF}$ at the node 131 by operating the switch 123.0 into closed state and the switch 122.0 into open state. Note that in the exemplified CR SAR ADC herein the MSB-2 corresponds to the Least Significant Bit (LSB), MSB-(N-1)=LSB.

The bank voltage signal $V_C$ to the comparator can now assume four different values depending on the MSB and MSB-1 of the digital data signal $D_{out}$[N-1, N-2]=$D_{out}$[MSB, MSB-1] determined in the previous approximation stages:

$D_{out}$[MSB, MSB-1]=(0, 0): The bank voltage signal $V_C$ to the comparator is $V_C=-V_{in}+\frac{1}{8}V_{ref}$;
$D_{out}$[MSB, MSB-1]=(0, 1): The bank voltage signal $V_C$ to the comparator is $V_C=-V_{in}+\frac{3}{8}V_{ref}$;
$D_{out}$[MSB, MSB-1]=(1, 0): The bank voltage signal $V_C$ to the comparator is $V_C=-V_{in}+\frac{5}{8}V_{ref}$; and
$D_{out}$[MSB, MSB-1]=(1, 1): The bank voltage signal $V_C$ to the comparator is $V_C=-V_{in}+\frac{7}{8}V_{ref}$.

If the bank voltage signal $V_C$ is greater than the base potential $V_B$, $V_C>V_B$, then the comparator 150 generates a comparison signal indicative of a logic 0 as the MSB-2. (The MSB-2 capacitor 121.1 (2·$C_0$) is switched back to the base potential $V_B$.) If otherwise the bank voltage signal $V_C$ is smaller than the base potential $V_B$, ($V_C<V_B$), the comparator 150 generates a comparison signal indicative of a logic 1 as the MSB-2 of the digital data signal $D_{out}$[N-3]. (The MSB capacitor 121.1 (2·$C_0$) remains connected to the reference voltage signal $V_{ref}$.)

Those skilled in the art will understand that the successive approximation process is continued until all binary weighted capacitors of the capacitor array 110 are switched accordingly in response to the output of the comparator 150.

Figure 3:
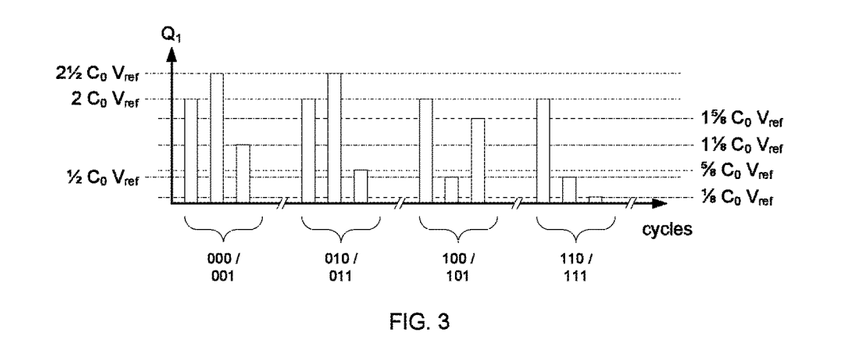
FIG. 3 shows a diagram, which illustrates the charges drawn by the exemplary CR SAR ADC shown in FIG. 2 from a reference source.

Whereas the above approximation process is known in the art, the attention should be drawn to the aspect of the charge flow drawn from the reference source required in each stage of the conversion phase to charge the binary weighted capacitors of the capacitor array 110 switched accordingly as schematically illustrated in FIG. 3 with respect to the exemplary CR SAR ADC 100 of FIG. 2. The possible charge flows are predefined by the design of the capacitor array 110. The actual charge flow in each cycle of the conversion phase depend on the switching state of the capacitor array 110 and hence depends on the analog input signal $V_{in}$ input to the ADC 100 and the digital data signal $D_{out}$ output from the ADC 100, respectively.

For instance, an actual switching state of the capacitor array 110 may be [100], which means that the MSB capacitor 121.2 is already charged. Assume that the comparator 150 generates a comparator signal indicative of a logic 0 as the MSB. Hence, switching state of the capacitor array 110 transitions to [010], which means that the MSB capacitor 121.2 is uncharged and the MSB-1 capacitor 121.1 is charged, which means $$Q_1([100] \to [010]) = 4 \cdot C_0 \cdot \frac{1}{2}V_{ref} + 2 \cdot C_0 \cdot \frac{1}{4}V_{ref}$$

$$= 2 \cdot C_0 \cdot V_{ref} + \frac{1}{2} \cdot C_0 \cdot V_{ref}$$

$$= 2\frac{1}{2} \cdot C_0 \cdot V_{ref}$$

Assume that the comparator 150 generates a comparator signal indicative of a logic 1 as the MSB. Hence, switching state of the capacitor array 110 transitions to [110], which means that the MSB capacitor 121.2 remains charged and the MSB-1 capacitor 121.1 is only charged, which means $$Q_1([1, 0, 0] \to [1, 1, 0]) = 2 \cdot C_0 \cdot \frac{1}{4}V_{ref}$$

$$= \frac{1}{2} \cdot C_0 \cdot V_{ref}$$

For instance, an actual switching state of the capacitor array 110 may be [110], which means that the MSB capacitor 121.2 and the MSB-1 capacitor 121.1 are already charged. Assume that the comparator 150 generates a comparator signal indicative of a logic 0 as the MSB. Hence, switching state of the capacitor array 110 further transitions to [101], which means that the MSB-1 capacitor 121.1 is uncharged and the MSB-2 capacitor 121.0 is charged, which means $$Q_1([1, 1, 0] \to [1, 0, 1]) = 2 \cdot C_0 \cdot \frac{3}{4}V_{ref} + C_0 \cdot \frac{1}{8}V_{ref}$$

$$= 1\frac{1}{2} \cdot C_0 \cdot V_{ref} + \frac{1}{8} \cdot C_0 \cdot V_{ref}$$

$$= 1\frac{5}{8} \cdot C_0 \cdot V_{ref}$$

Assume that the comparator 150 generates a comparator signal indicative of a logic 1 as the MSB. Hence, switching state of the capacitor array 110 further transitions to [111], which means that the MSB-1 capacitor 121.1 remains charged and the MSB-2 capacitor 121.0 is only charged, which means $$Q_1([1, 1, 0] \to [1, 1, 1]) = C_0 \cdot \frac{1}{8}V_{ref}$$

$$= \frac{1}{8} \cdot C_0 \cdot V_{ref}$$

Figure 4:
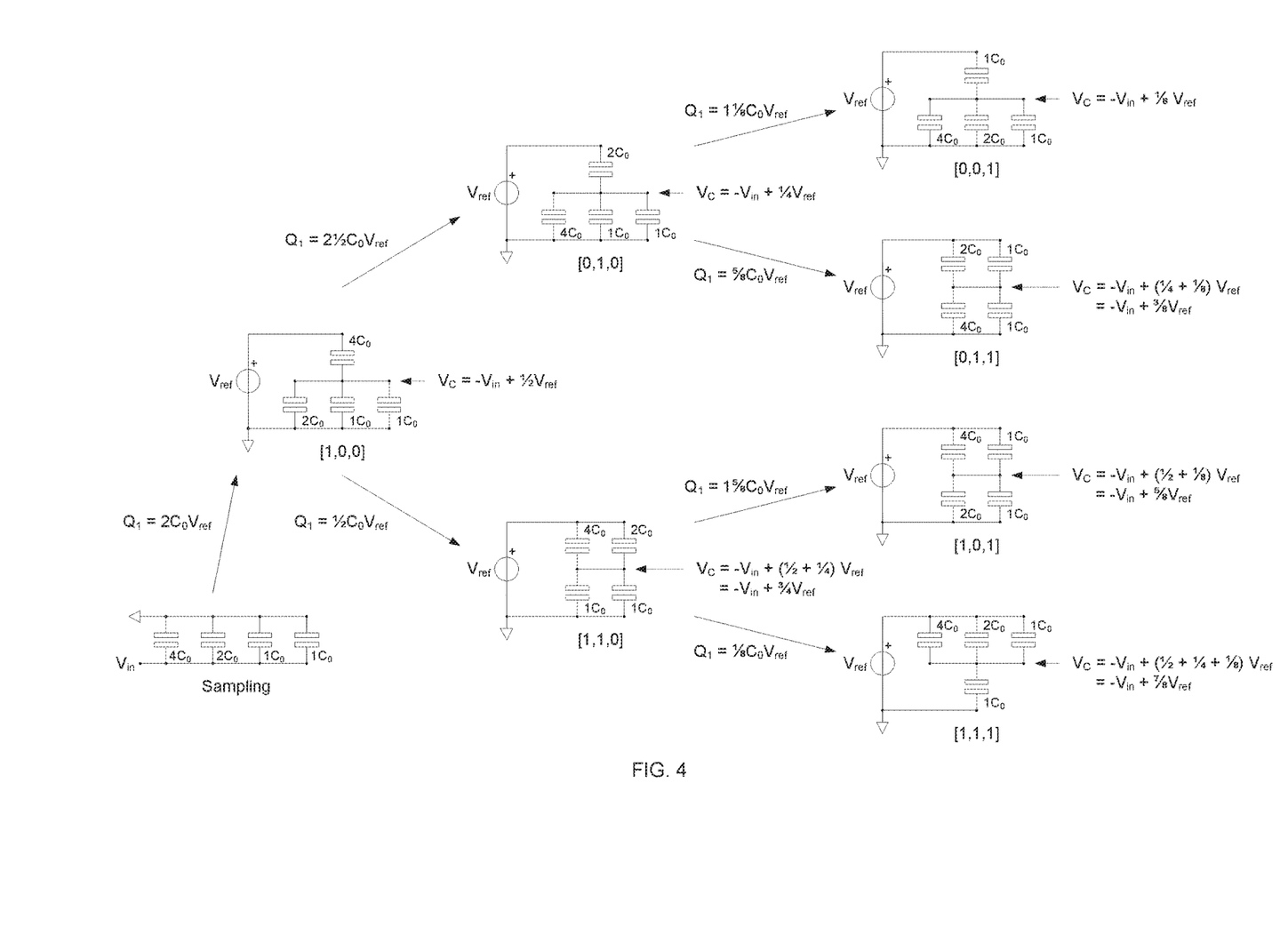
FIG. 4 schematically depicts a tree like representation of the different switching states of the capacitor array of the exemplary CR SAR ADC shown in FIG. 2.

The following tables summarizes the charge flows occurring due to the selective switching of the capacitors within the capacitor array 110 with respect to the possible digital data signals $D_{out}$ as also schematically in the tree like depiction of the switching states illustrated in FIG. 4.

In case the analog voltage $V_{in}$, corresponds to digital data signals $D_{out}$[2:0]=(000) or (001):

| Cycle | Charge $Q_1$ drawn by example ADC | Switching state |
|---|---|---|
| MSB | 2 · $V_{ref}$ · $C_0$ | [1,0,0] |
| MSB-1 | 2½ · $V_{ref}$ · $C_0$ | [0,1,0] |
| MSB-2 | 1⅛ · $V_{ref}$ · $C_0$ | [0,0,1] |

In case the analog voltage $V_{in}$ corresponds to digital data signals $D_{out}$[2:0]=(010) or (011):

| Cycle | Charge $Q_1$ drawn by example ADC | Switching state |
|---|---|---|
| MSB | $2 \cdot V_{ref} \cdot C_0$ | [1,0,0] |
| MSB-1 | $2\frac{1}{2} \cdot V_{ref} \cdot C_0$ | [0,1,0] |
| MSB-2 | $\frac{5}{8} \cdot V_{ref} \cdot C_0$ | [0,1,1] |

In case the analog voltage $V_{in}$, corresponds to digital data signals $D_{out}[2:0]=(100)$ or (101):

| Cycle | Charge $Q_1$ drawn by example ADC | Switching state |
|---|---|---|
| MSB | $2 \cdot V_{ref} \cdot C_0$ | [1,0,0] |
| MSB-1 | $\frac{1}{2} \cdot V_{ref} \cdot C_0$ | [1,1,0] |
| MSB-2 | $1\frac{5}{8} \cdot V_{ref} \cdot C_0$ | [1,0,1] |

In case the analog voltage $V_{in}$, corresponds to digital data signals $D_{out}[2:0]=(110)$ or (111):

| Cycle | Charge $Q_1$ drawn by example ADC | Switching state |
|---|---|---|
| MSB | $2 \cdot V_{ref} \cdot C_0$ | [1,0,0] |
| MSB-1 | $\frac{1}{2} \cdot V_{ref} \cdot C_0$ | [1,1,0] |
| MSB-2 | $\frac{1}{8} \cdot V_{ref} \cdot C_0$ | [1,1,1] |

Wherein the switching state

[1,-,-] means that the MSB capacitor 121.2 is connected to the reference source;

[0,-,-] means that the MSB capacitor 121.2 is connected to the base potential;

[-,1,-] means that the MSB-1 capacitor 121.1 is connected to the reference source;

[-,0,-] means that the MSB-1 capacitor 121.1 is connected to the base potential;

[-,-,1] means that the MSB-2 (or LSB) capacitor 121.0 is connected to the reference source; and

[-,-,0] means that the MSB-2 (or LSB) capacitor 121.0 is connected to the base potential.

During the sampling phase, there is no current drawn by the capacitor array 110 from the reference source. The capacitors of the capacitor array 110 are charged using the analog input signal $V_{in}$.

| Cycle | Charge $Q_1$ drawn by example ADC |
|---|---|
| 0 | 0 |
| ... | 0 |
| N (N ≥ 0) | 0 |

The exemplary CR SAR ADC of FIG. 2 draws a maximum charge of $Q_1^{max}=2\frac{1}{2}V_{ref} \cdot C_0$ from the reference source during the conversion phase.

It should be noted that $$I(t) = \frac{dQ(t)}{dt}$$

$$Q(t) = \int_0^t I(t')dt'$$

Assuming a constant or substantially constant resistance R when charging the one or more capacitors of the array 110:

$$I(t) = \frac{V_{ref}}{R} e^{-\frac{t}{\tau}}$$

Where the time constant τ is defined by the resistance R and the capacitance C, which is charged:

$$\tau = R \cdot C$$

Herein, the voltage applied is the reference signal $V_{ref}$:

$$Q(t) = \int_0^\infty \frac{V}{R} e^{-\frac{t'}{\tau}} dt' = \frac{V \cdot \tau}{R} = V \cdot C$$

Moreover, the charge is drawn by the capacitor array 110 on switchably transitioning from one switching state to the consecutive switching state.

As aforementioned, consecutive conversion phase cycles may undergo interference from previous conversion phase cycles due to voltage drops and incomplete settling of the voltage of the reference voltage signal $V_{ref}$ provided by the reference source 200. In the state of the art, the issue is solved by providing a more powerful reference source or interposing a decoupling capacitor. A more powerful reference source leads to a higher power consumption, which is in particular contrary to the low-power predicate of CR SAR ADCs but not limited thereto. The same applies to further ADC implementations. Decoupling capacitors require size dimensions, which are in particular a disadvantage for on-chip implementations. More particularly, the size dimensions required for high-resolution ADCs become extensively large and may even exceed the area required by the ADCs by orders of magnitude.

According to the present application, an additional charge drawing circuit is suggested. Referring back to FIG. 1, the schematic block diagram further includes an equalization circuit, EQ circuit, 300, which is connected to a reference source 200 supplying a reference voltage signal $V_{ref}$ to the ADC 100 and the EQ circuit 300. The analog-to-digital converter (ADC) 100 and the equalization circuit, EQ circuit, 300 may be connected in parallel to the reference source 200.

The EQ circuit 300 is designed to expose a configurable effective load to the reference source 200. The configurability of the effective load is for instance realized by a plurality of distinct loads comprised by the EQ circuit 300. The distinct loads of the EQ circuit 300 are for instance selectively switchable to from a plurality of distinct effective loads for being exposed to the reference source 200. The EQ circuit 300 may comprise a bank of loads, e.g. capacitive loads, which are individually and selectively switchable. An effective load of the EQ circuit is obtained by switching one or more of the distinct loads of the EQ circuit 300.

The EQ circuit 300 is arranged to draw a configurable charge $Q_2$ from the reference source 200. The EQ circuit 300 is connected to the ADC 100 and receives an internal state information from the ADC 100. The internal state information relates to an actual state of the ADC 100 including in particular state information about the current conversion phase cycle. The internal state information provided by the ADC 100 is indicative of a charge $Q_1$ drawn by the ADC 100 from the reference source 200. It should be noted that the charge $Q_1$ drawn by the ADC 100 is predefined by the design/implementation of the ADC 100. The charge $Q_1$ drawn by the ADC 100 is deterministic in each state thereof. In particular, the charge $Q_1$ drawn by the ADC 100 is deterministically predefined in each (conversion phase/sampling phase) cycle of the operation of the ADC 100. As illustratively described above, the charge $Q_1$ drawn by the ADC 100 deterministically predefined by an actual switching state and the previous switching state of the capacitor array 110.

In response to the internal state information, e.g. relating to the switching state of the capacitor array 110 of the ADC 100, received by a control logic of the EQ circuit 300 from the ADC 100, the EQ circuit 300 is switchably reconfigurable to draw a charge $Q_2$ from the reference source 200 such that the total charge $Q_{ref}$ drawn by the ADC 100 and the EQ circuit 300 from the reference source 200 is constant for any conversion cycle.

$$Q_{ref}(\text{cycle})=Q_1(\text{cycle})+Q_2(\text{cycle})=\text{constant}.$$

The total charge $Q_{ref}$ is in particular at least substantially equal to the maximal charge $\max(Q_1)$ drawn by the ADC 100 from the reference source 200 in any conversion cycle. The total charge $Q_{ref}$ may be $$Q_{ref} \geq Q_1^{max}.$$

The ADC 100 and the EQ circuit 300 may draw the charges $Q_1$ and $Q_2$ at substantially the same point in time from reference source 200. The EQ circuit 300 is configured to draw the charge $Q_2$ from the reference source 200 substantially in synchronicity with the ADC 100.

Figure 5:
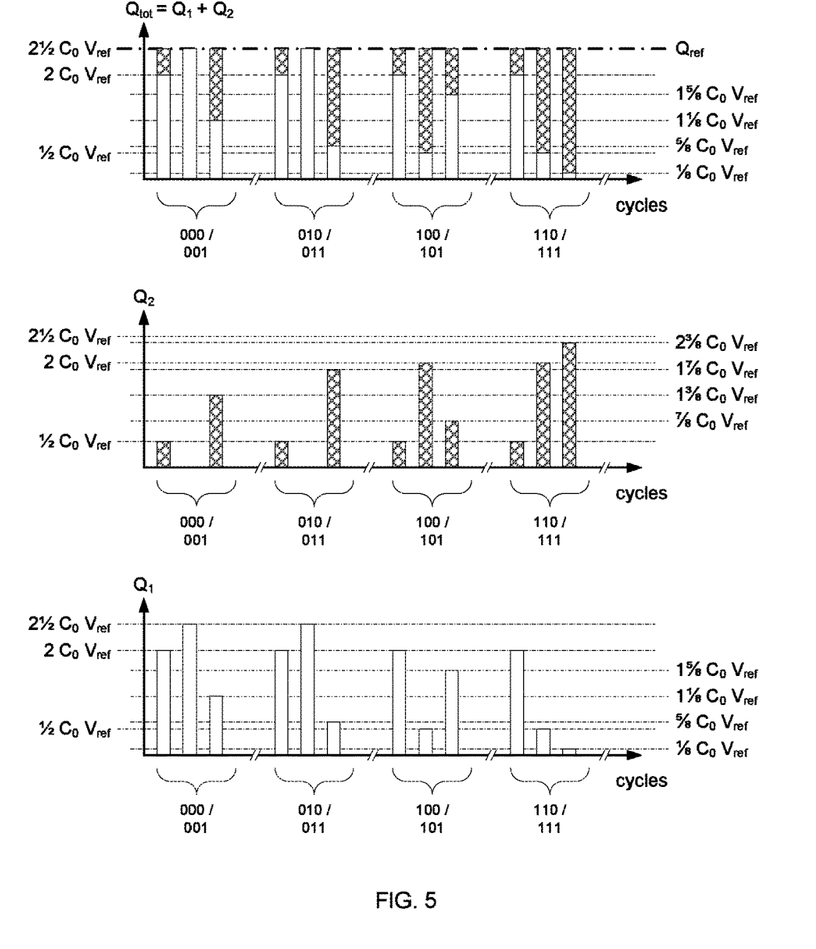
FIG. 5 shows diagrams illustrating a charge $Q_2$ drawn by the EQ circuit and the total charge $Q_{ref}$ drawn from the reference source in different cycles according to an example of the present application.

Referring now to the above tables and FIG. 5, the operation of the EQ circuit 300 is further explained with respect to the exemplary CR SAR ADC of FIG. 2. The charge $Q_1$ drawn by the exemplary CR SAR ADC from the reference source is summarized in the above tables with respect to each conversion phase cycle as also illustrated in FIGS. 3 and 4. The below tables are based on the above tables and further include the charge $Q_2$ drawn by the EQ circuit 300 on condition that $$Q_{ref}=Q_{ref}(\text{cycle})=Q_1^{max}=2\tfrac{1}{2} \cdot V_{ref} C_0$$

Those skilled in the art will understand that the present application is not limited to the above-specified total reference charge $Q_{ref}=Q_1^{max}$, which is merely illustrative. The charge $Q_2$ drawn by the EQ circuit 300 and the total charge $Q_{tot}=Q_1+Q_2$ is illustratively shown in FIG. 5.

In case the analog voltage $V_{in}$ corresponds to the digital data signal $D_{out}[2:0]=(000)$ or the digital data signal $D_{out}[2:0]=(001)$:

| Cycle | Charge $Q_1$ drawn by example ADC | Charge $Q_2$ drawn by EQ circuit | Total charge $Q_{tot}$ drawn from Source | Switching state |
|---|---|---|---|---|
| MSB | $2 \cdot V_{ref} \cdot C_0$ | $\tfrac{1}{2} \cdot V_{ref} \cdot C_0$ | $2\tfrac{1}{2} \cdot V_{ref} \cdot C_0$ | [1,0,0] |
| MSB-1 | $2\tfrac{1}{2} \cdot V_{ref} \cdot C_0$ | 0 | $2\tfrac{1}{2} \cdot V_{ref} \cdot C_0$ | [0,1,0] |
| MSB-2 | $1\tfrac{1}{8} \cdot V_{ref} \cdot C_0$ | $1\tfrac{3}{8} \cdot V_{ref} \cdot C_0$ | $2\tfrac{1}{2} \cdot V_{ref} \cdot C_0$ | [0,0,1] |

In case the analog voltage $V_{in}$ corresponds to the digital data signal $D_{out}[2:0]=(010)$ or the digital data signal $D_{out}[2:0]=(011)$:

| Cycle | Charge $Q_1$ drawn by example ADC | Charge $Q_2$ drawn by EQ circuit | Total charge $Q_{tot}$ drawn from Source | Switching state |
|---|---|---|---|---|
| MSB | $2 \cdot V_{ref} \cdot C_0$ | $\tfrac{1}{2} \cdot V_{ref} \cdot C_0$ | $2\tfrac{1}{2} \cdot V_{ref} \cdot C_0$ | [1,0,0] |
| MSB-1 | $2\tfrac{1}{2} \cdot V_{ref} \cdot C_0$ | 0 | $2\tfrac{1}{2} \cdot V_{ref} \cdot C_0$ | [0,1,0] |
| MSB-2 | $\tfrac{5}{8} \cdot V_{ref} \cdot C_0$ | $1\tfrac{7}{8} \cdot V_{ref} \cdot C_0$ | $2\tfrac{1}{2} \cdot V_{ref} \cdot C_0$ | [0,1,1] |

In case the analog voltage $V_{in}$ corresponds to the digital data signal $D_{out}[2:0]=(100)$ or the digital data signal $D_{out}[2:0]=(101)$:

| Cycle | Charge $Q_1$ drawn by example ADC | Charge $Q_2$ drawn by EQ circuit | Total charge $Q_{tot}$ drawn from Source | Switching state |
|---|---|---|---|---|
| MSB | $2 \cdot V_{ref} \cdot C_0$ | $\tfrac{1}{2} \cdot V_{ref} \cdot C_0$ | $2\tfrac{1}{2} \cdot V_{ref} \cdot C_0$ | [1,0,0] |
| MSB-1 | $\tfrac{1}{2} \cdot V_{ref} \cdot C_0$ | $2 \cdot V_{ref} \cdot C_0$ | $2\tfrac{1}{2} \cdot V_{ref} \cdot C_0$ | [1,1,0] |
| MSB-2 | $1\tfrac{5}{8} \cdot V_{ref} \cdot C_0$ | $\tfrac{7}{8} \cdot V_{ref} \cdot C_0$ | $2\tfrac{1}{2} \cdot V_{ref} \cdot C_0$ | [1,0,1] |

In case the analog voltage $V_{in}$ corresponds to the digital data signal $D_{out}[2:0]=(110)$ or the digital data signal $D_{out}[2:0]=(111)$:

| Cycle | Charge $Q_1$ drawn by example ADC | Charge $Q_2$ drawn by EQ circuit | Total charge $Q_{tot}$ drawn from Source | Switching state |
|---|---|---|---|---|
| MSB | $2 \cdot V_{ref} \cdot C_0$ | $\tfrac{1}{2} \cdot V_{ref} \cdot C_0$ | $2\tfrac{1}{2} \cdot V_{ref} \cdot C_0$ | [1,0,0] |
| MSB-1 | $\tfrac{1}{2} \cdot V_{ref} \cdot C_0$ | $2 \cdot V_{ref} \cdot C_0$ | $2\tfrac{1}{2} \cdot V_{ref} \cdot C_0$ | [1,1,0] |
| MSB-2 | $\tfrac{1}{8} \cdot V_{ref} \cdot C_0$ | $2\tfrac{3}{8} \cdot V_{ref} \cdot C_0$ | $2\tfrac{1}{2} \cdot V_{ref} \cdot C_0$ | [1,1,1] |

During the sampling phase, there is no current drawn by the capacitor array 110 from the reference source. The capacitors of the capacitor array 110 are charged using the analog input signal $V_{in}$.

| Cycle | Charge $Q_1$ drawn by example ADC | Charge $Q_2$ drawn by EQ circuit | Total charge $Q_{tot}$ drawn from Source |
|---|---|---|---|
| 0 | 0 | $2\tfrac{1}{2} \cdot V_{ref} \cdot C_0$ | $2\tfrac{1}{2} \cdot V_{ref} \cdot C_0$ |
| 1 | 0 | $2\tfrac{1}{2} \cdot V_{ref} \cdot C_0$ | $2\tfrac{1}{2} \cdot V_{ref} \cdot C_0$ |
| ... | 0 | $2\tfrac{1}{2} \cdot V_{ref} \cdot C_0$ | $2\tfrac{1}{2} \cdot V_{ref} \cdot C_0$ |
| N (N ≥ 0) | 0 | $2\tfrac{1}{2} \cdot V_{ref} \cdot C_0$ | $2\tfrac{1}{2} \cdot V_{ref} \cdot C_0$ |

The exemplary CR SAR ADC draws a maximum charge of $Q_1^{max}=2\tfrac{1}{2}V_{ref}C_0$ from the reference source during the conversion phase.

Figure 6:
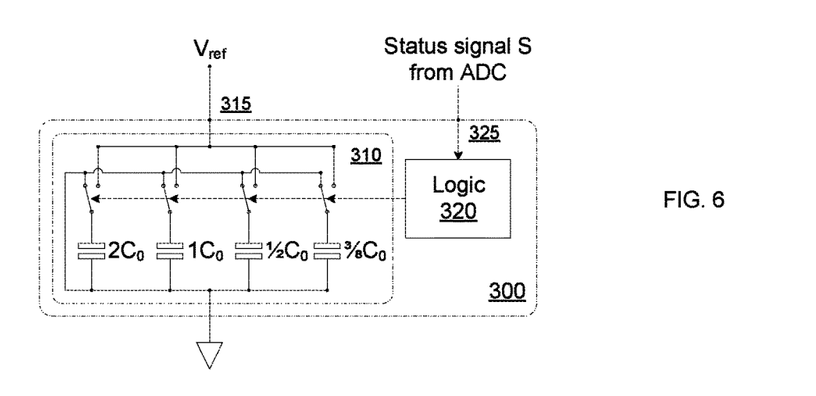
FIG. 6 schematically illustrates a block diagram of an EQ circuit according to an example of the present application.

Referring now further to FIG. 6, a block diagram of an exemplary EQ circuit according to the present application is schematically illustrated. The exemplary EQ circuit 300 shown in FIG. 6 is designed to be used in conjunction with the exemplary CR SAR ADC of FIG. 2. The exemplary EQ circuit 300 comprises four capacitors of different capacitance, which are selectively and individually switchable to be coupled to the reference source. The capacitors are connected in parallel to each other. Hence, a resultant capacitance of the exemplary EQ circuit 300 can be calculated by summarizing the capacitances of the selectively switched capacitors. The capacitances of the capacitors is selected to realize the different charge $Q_2$ shown in the above tables. For instance, the capacitances of the capacitors include $2 \cdot C_0$, $C_0$, $\tfrac{1}{2} \cdot C_0$, and $\tfrac{3}{8} \cdot C_0$. The exemplary EQ circuit 300 further includes a logic 310, which is coupled to the CR SAR ADC logic 140 to receive an actual switching state of the capacitor array 110 of the CR SAR ADC logic 140. The EQ circuit 300 comprises a control logic 320, which is arranged to receive a status signal S from the CR SAR ADC 100. The status signal S is indicative of at least the switching state of the CR SAT ADC 100. The control logic 320 operates the switches to connect one or more capacitors which the required total capacitance to the reference source 200. The control logic 320 may be a state machine responsive to the status signal S received from the CR SAT ADC 100.

The following table shows the switched capacitors of EQ circuit 300 with respect to the switching state of the capacitor array 110 of the CR SAR ADC logic 140. The exemplary EQ circuit and the switching states exemplarily illustrates an EQ circuit adapted to draw a charge $Q_1$ such that in each cycle a total charge $Q_{ref}=Q_1^{max}=2\frac{1}{2} \cdot V_{ref} \cdot C_0$ is drawn from the reference source as set forth above with reference to FIG. 5.

| Charge drawn by EQ Circuit | Switched Capacitors of EQ circuit | ADC Array switching state | Conversion Phase Cycles |
|---|---|---|---|
| 0 | — | | Switched capacitors of last sampling phase cycle |
| $\frac{1}{2} \cdot V_{ref} \cdot C_0$ | $\frac{1}{2} \cdot C_0$ | [1,0,0] | MSB |
| 0 | 0 | [0,1,0] | MSB-1 |
| $1\frac{3}{8} \cdot V_{ref} \cdot C_0$ | $1 \cdot C_0 \parallel \frac{3}{8} \cdot C_0$ | [0,0,1] | MSB-2 |
| $1\frac{7}{8} \cdot V_{ref} \cdot C_0$ | $1 \cdot C_0 \parallel \frac{1}{2} \cdot C_0 \parallel \frac{3}{8} \cdot C_0$ | [0,1,1] | MSB-2 |
| $\frac{1}{2} \cdot V_{ref} \cdot C_0$ | $\frac{1}{2} \cdot C_0$ | [1,0,0] | MSB |
| $2 \cdot V_{ref} \cdot C_0$ | $2 \cdot C_0$ | [1,1,0] | MSB-1 |
| $\frac{7}{8} \cdot V_{ref} \cdot C_0$ | $\frac{1}{2} \cdot C_0 \parallel \frac{3}{8} \cdot C_0$ | [1,0,1] | MSB-2 |
| $2\frac{3}{8} \cdot V_{ref} \cdot C_0$ | $2 \cdot C_0 \parallel \frac{3}{8} \cdot C_0$ | [1,1,1] | MSB-2 |

In the sampling phase, the EQ circuit 300 is used to draw the total charge $Q_2=Q_1^{max}=2\frac{1}{2} \cdot V_{ref} \cdot C_0$ from the reference source as shown in the following table, where i is an integer value and indexes the sampling phase cycles.

| Charge drawn by EQ Circuit | Switched Capacitors of EQ circuit | ADC Array switching state | Sampling Phase Cycles |
|---|---|---|---|
| $2\frac{1}{2} \cdot V_{ref} \cdot C_0$ | $2 \cdot C_0 \parallel \frac{1}{2} \cdot C_0$ | — | i |

It should be noted that the total number of clock cycles used for the sampling phase can differ from application to application, and is amongst other things dependent on the drive strength of the circuit driving the ADC input.

Figure 7A:
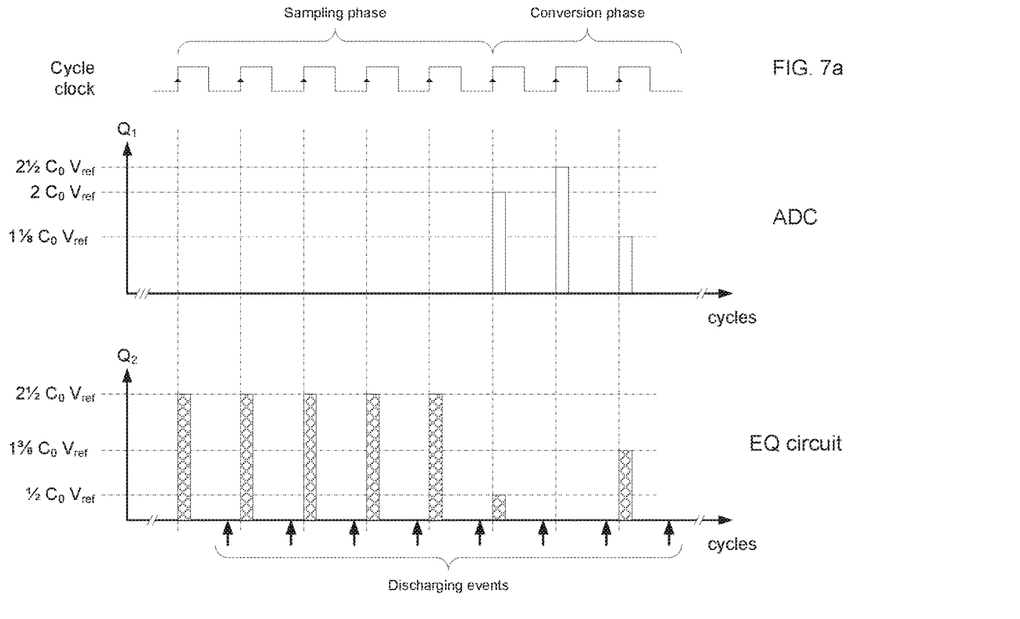
FIG. 7 schematically depict the different switching states of the capacitor array of the exemplary EQ circuit shown in FIG. 6.
Figure 7B:
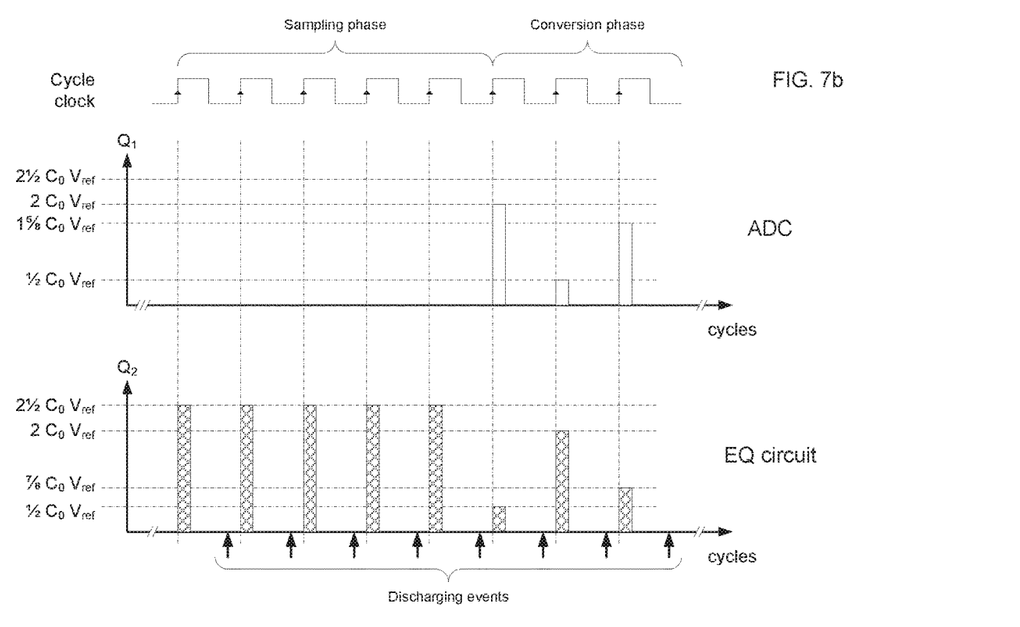

FIGS. 7a and 7b exemplarily illustrate the charges drawn by the exemplary CR SAR ADC and the EQ circuit with respect to two exemplary analog voltages $V_{in}$ applied to the CR SAR ADC for conversion. The charges drawn by the exemplary CR SAR ADC and the EQ circuit are illustrated against sampling phase and conversion phase cycles of the CR SAR ADC. The individual cycles are schematically depicted in form of a cycle clock signal, wherein each cycle starts at the raising edge of the signal, for the sake of illustration. Further, a sampling phase having a length of five sampling phase cycles is illustrated, for the sake of explanation only, on which a conversion phase having the length of three conversion phase cycles follows according to the implementation of the exemplary CR SAR ADC.

In particular, FIG. 7a exemplarily illustrate the drawn charges with respect to an analog voltages corresponding to the digital data signal $D_{out}[2:0]=(000)$ and the digital data signal $D_{out}[2:0]=(001)$, respectively. The analog voltages $V_{in}$ is sampled during the sampling phase. During the sampling phase, the CR SAR ADC does not draw a charge from the reference source, however, the EQ circuit is operated to draw the total charge $Q_2=Q_1^{max}=2\frac{1}{2} \cdot V_{ref} \cdot C_0$ from the reference source in each sampling phase cycle. In the conversion phase, the EQ circuit is operated to draw in each cycle an individual charge from the reference source, which supplements to the total charge $Q_{tot}$. As already described above, following charges are drawn by the CR SAR ADC and the EQ circuit:

| Cycle | Charge $Q_1$ drawn by example ADC | Charge $Q_2$ drawn by EQ circuit | Total charge $Q_{tot}$ drawn from Source | Switching state |
|---|---|---|---|---|
| Sample #1 | 0 | $2\frac{1}{2} \cdot V_{ref} \cdot C_0$ | $2\frac{1}{2} \cdot V_{ref} \cdot C_0$ | — |
| Sample #2 | 0 | $2\frac{1}{2} \cdot V_{ref} \cdot C_0$ | $2\frac{1}{2} \cdot V_{ref} \cdot C_0$ | — |
| Sample #3 | 0 | $2\frac{1}{2} \cdot V_{ref} \cdot C_0$ | $2\frac{1}{2} \cdot V_{ref} \cdot C_0$ | — |
| Sample #4 | 0 | $2\frac{1}{2} \cdot V_{ref} \cdot C_0$ | $2\frac{1}{2} \cdot V_{ref} \cdot C_0$ | — |
| Sample #5 | 0 | $2\frac{1}{2} \cdot V_{ref} \cdot C_0$ | $2\frac{1}{2} \cdot V_{ref} \cdot C_0$ | — |
| MSB | $2 \cdot V_{ref} \cdot C_0$ | $\frac{1}{2} \cdot V_{ref} \cdot C_0$ | $2\frac{1}{2} \cdot V_{ref} \cdot C_0$ | [1,0,0] |
| MSB-1 | $2\frac{1}{2} \cdot V_{ref} \cdot C_0$ | 0 | $2\frac{1}{2} \cdot V_{ref} \cdot C_0$ | [0,1,0] |
| MSB-2 | $1\frac{1}{8} \cdot V_{ref} \cdot C_0$ | $1\frac{3}{8} \cdot V_{ref} \cdot C_0$ | $2\frac{1}{2} \cdot V_{ref} \cdot C_0$ | [0,0,1] |

The capacitance drawn by the EQ circuit in each cycle is discharged for instance by switchable connecting the capacitors to ground in advance to each new cycle, which is illustratively indicated as "discharging events". In an example, the logic of the EQ circuit, which controls the switching of the capacitances, is configured to switch the capacitors to ground at a predefined period with respect to the start of each cycle, e.g. at 75% of the cycle duration.

In particular, FIG. 7b exemplarily illustrate the drawn charges with respect to an analog voltages $V_{in}$ corresponding to the digital data signal $D_{out}[2:0]=(100)$ and the digital data signal $D_{out}[2:0]=(101)$, respectively. During the sampling phase, the EQ circuit is operated to draw the total charge $Q_2=Q_1^{max}=2\frac{1}{2} \cdot V_{ref} \cdot C_0$ from the reference source in each sampling phase cycle. In the conversion phase, the EQ circuit is operated to draw in each cycle an individual charge from the reference source, which supplements to the total charge $Q_{tot}$. As already described above, following charges are drawn by the CR SAR ADC and the EQ circuit:

| Cycle | Charge $Q_1$ drawn by example ADC | Charge drawn by EQ circuit | Total charge $Q_{tot}$ drawn from Source | Switching state |
|---|---|---|---|---|
| Sample #1 | 0 | $2\frac{1}{2} \cdot V_{ref} \cdot C_0$ | $2\frac{1}{2} \cdot V_{ref} \cdot C_0$ | — |
| Sample #2 | 0 | $2\frac{1}{2} \cdot V_{ref} \cdot C_0$ | $2\frac{1}{2} \cdot V_{ref} \cdot C_0$ | — |
| Sample #3 | 0 | $2\frac{1}{2} \cdot V_{ref} \cdot C_0$ | $2\frac{1}{2} \cdot V_{ref} \cdot C_0$ | — |
| Sample #4 | 0 | $2\frac{1}{2} \cdot V_{ref} \cdot C_0$ | $2\frac{1}{2} \cdot V_{ref} \cdot C_0$ | — |
| Sample #5 | 0 | $2\frac{1}{2} \cdot V_{ref} \cdot C_0$ | $2\frac{1}{2} \cdot V_{ref} \cdot C_0$ | — |
| MSB | $2 \cdot V_{ref} \cdot C_0$ | $\frac{1}{2} \cdot V_{ref} \cdot C_0$ | $2\frac{1}{2} \cdot V_{ref} \cdot C_0$ | [1,0,0] |
| MSB-1 | $\frac{1}{2} \cdot V_{ref} \cdot C_0$ | $2 \cdot V_{ref} \cdot C_0$ | $2\frac{1}{2} \cdot V_{ref} \cdot C_0$ | [0,1,0] |
| MSB-2 | $1\frac{5}{8} \cdot V_{ref} \cdot C_0$ | $\frac{7}{8} \cdot V_{ref} \cdot C_0$ | $2\frac{1}{2} \cdot V_{ref} \cdot C_0$ | [0,0,1] |

The capacitance drawn by the EQ circuit in each cycle is discharged for instance by switchable connecting the capacitors to ground in advance to each new cycle, which is illustratively indicated as "discharging events". In an example, the logic of the EQ circuit, which controls the switching of the capacitances, is configured to switch the capacitors to ground at a predefined period with respect to the start of each cycle, e.g. at 75% of the cycle duration.

Figure 8:
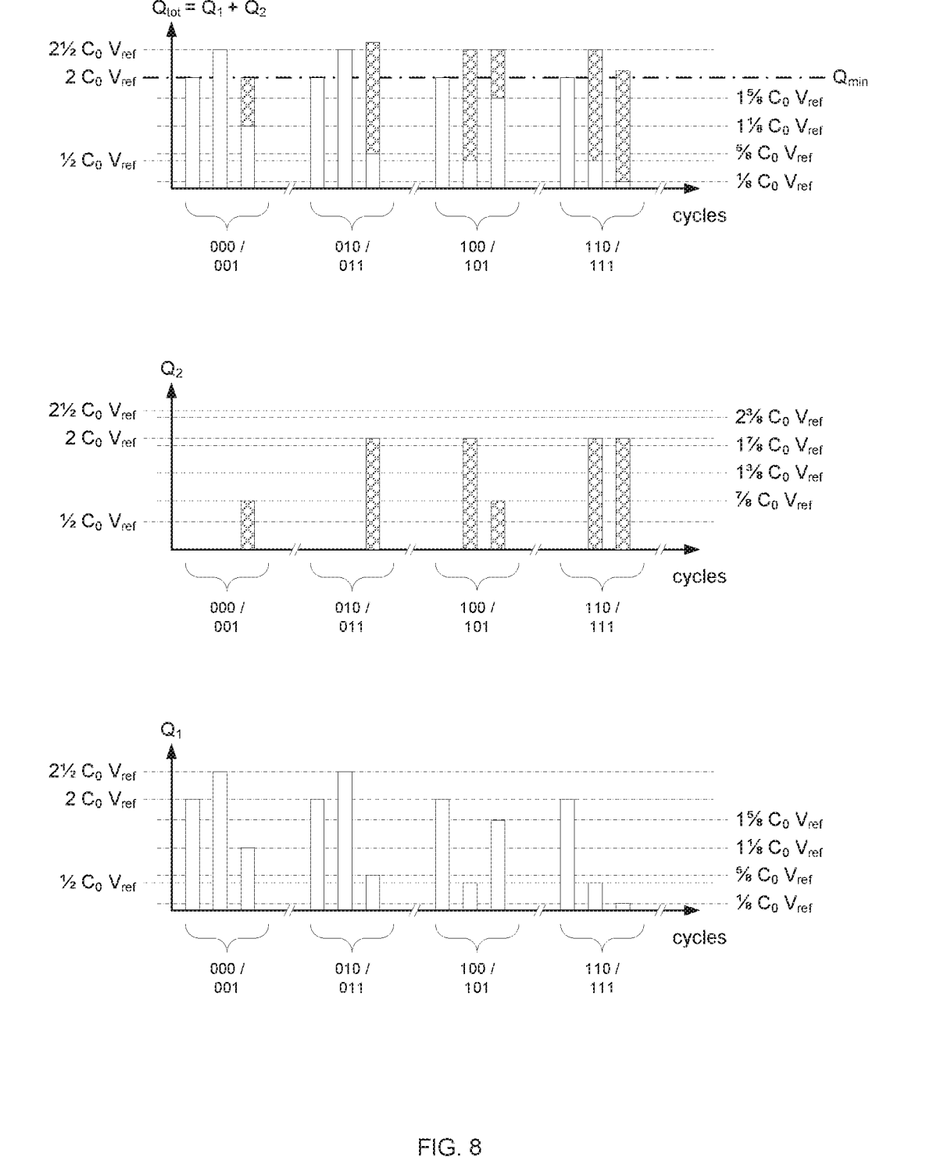
FIG. 8 shows diagrams illustrating a charge $Q_2$ drawn by another example of the EQ circuit and the total charge $Q_{ref}$ drawn from the reference source in different cycles according to an example of the present application.

The aforementioned EQ circuit 300 has been described to be designed to contribute to the ADC 100 such that a constant total reference charge $Q_{ref}$ is drawn from the reference source 200 independent of the conversion phase cycle and the sampling phase cycle, respectively. The constant total charge $Q_{ref}$ has been described to preferably be at least equal to the maximum charge $Q_1^{max}$ drawn by the ADC 100 in one of the conversion phase cycles. In a further embodiment, the EQ circuit 300 is designed such that at least a minimum total charge $Q_{min}$ is drawn from the reference source 200, which may be less than the maximum charge $Q_1^{max}$ drawn by the ADC 100, as exemplary illustrated in FIG. 8 in the context of the above described exemplary CR SAR ADC 100. Although the charge drawn from the reference source 200 is not constant any more in each (conversion phase) cycle, the variation of the charges $Q_1$ drawn from the reference source 200 by the ADC 100 can be significantly reduced by the EQ circuit, which draws supplementary charges $Q_2$ ensuring that the total charges $Q_{ref}$ drawn from the reference source 200 is at least equal to the predefined minimum total charge $Q_{min}$. The below tables are based on the above tables and further include the charge $Q_2$ drawn by the EQ circuit 300 on condition that $Q_{min} = 2 \cdot V_{ref} \cdot C_0$ and $Q_{ref} \geq Q_{min}$ for the sake of illustration.

In case the analog voltage $V_{in}$, corresponds to digital data signals $D_{out}[2:0]=(000)$ or $(001)$:

| Cycle | Charge $Q_1$ drawn by example ADC | Charge $Q_2$ drawn by EQ circuit | Total charge $Q_{tot}$ drawn from Source | Switching state |
|---|---|---|---|---|
| MSB | $2 \cdot V_{ref} \cdot C_0$ | 0 | $2 \cdot V_{ref} \cdot C_0$ | [1,0,0] |
| MSB-1 | $2\frac{1}{2} \cdot V_{ref} \cdot C_0$ | 0 | $2\frac{1}{2} \cdot V_{ref} \cdot C_0$ | [0,1,0] |
| MSB-2 | $1\frac{1}{8} \cdot V_{ref} \cdot C_0$ | $\frac{7}{8} \cdot V_{ref} \cdot C_0$ | $2 \cdot V_{ref} \cdot C_0$ | [0,0,1] |

In case the analog voltage $V_{in}$, corresponds to digital data signals $D_{out}[2:0]=(010)$ or $(011)$:

| Cycle | Charge $Q_1$ drawn by example ADC | Charge $Q_2$ drawn by EQ circuit | Total charge $Q_{tot}$ drawn from Source | Switching state |
|---|---|---|---|---|
| MSB | $2 \cdot V_{ref} \cdot C_0$ | 0 | $2 \cdot V_{ref} \cdot C_0$ | [1,0,0] |
| MSB-1 | $2\frac{1}{2} \cdot V_{ref} \cdot C_0$ | 0 | $2\frac{1}{2} \cdot V_{ref} \cdot C_0$ | [0,1,0] |
| MSB-2 | $\frac{5}{8} \cdot V_{ref} \cdot C_0$ | $2 \cdot V_{ref} \cdot C_0$ | $2\frac{5}{8} \cdot V_{ref} \cdot C_0$ | [0,1,1] |

In case the analog voltage $V_{in}$, corresponds to digital data signals $D_{out}[2:0]=(100)$ or $(101)$:

| Cycle | Charge $Q_1$ drawn by example ADC | Charge $Q_2$ drawn by EQ circuit | Total charge $Q_{tot}$ drawn from Source | Switching state |
|---|---|---|---|---|
| MSB | $2 \cdot V_{ref} \cdot C_0$ | 0 | $2 \cdot V_{ref} \cdot C_0$ | [1,0,0] |
| MSB-1 | $\frac{1}{2} \cdot V_{ref} \cdot C_0$ | $2 \cdot V_{ref} \cdot C_0$ | $2\frac{1}{2} \cdot V_{ref} \cdot C_0$ | [1,1,0] |
| MSB-2 | $1\frac{5}{8} \cdot V_{ref} \cdot C_0$ | $\frac{7}{8} \cdot V_{ref} \cdot C_0$ | $2\frac{1}{2} \cdot V_{ref} \cdot C_0$ | [1,0,1] |

In case the analog voltage $V_{in}$, corresponds to digital data signals $D_{out}[2:0]=(110)$ or $(111)$:

| Cycle | Charge $Q_1$ drawn by example ADC | Charge $Q_2$ drawn by EQ circuit | Total charge $Q_{tot}$ drawn from Source | Switching state |
|---|---|---|---|---|
| MSB | $2 \cdot V_{ref} \cdot C_0$ | 0 | $2 \cdot V_{ref} \cdot C_0$ | [1,0,0] |
| MSB-1 | $\frac{1}{2} \cdot V_{ref} \cdot C_0$ | $2 \cdot V_{ref} \cdot C_0$ | $2\frac{1}{2} \cdot V_{ref} \cdot C_0$ | [1,1,0] |
| MSB-2 | $\frac{1}{8} \cdot V_{ref} \cdot C_0$ | $2 \cdot V_{ref} \cdot C_0$ | $2\frac{1}{8} \cdot V_{ref} \cdot C_0$ | [1,1,1] |

During the sampling phase:

| Cycle | Charge $Q_1$ drawn by example ADC | Charge $Q_2$ drawn by EQ circuit | Total charge $Q_{tot}$ drawn from Source |
|---|---|---|---|
| 0 | 0 | $2 \cdot V_{ref} \cdot C_0$ | $2 \cdot V_{ref} \cdot C_0$ |
| ... | 0 | $2 \cdot V_{ref} \cdot C_0$ | $2 \cdot V_{ref} \cdot C_0$ |
| N (N ≥ 0) | 0 | $2 \cdot V_{ref} \cdot C_0$ | $2 \cdot V_{ref} \cdot C_0$ |

Those skilled in the art will immediately understand that the above properties of the EQ circuit are merely illustrative and not intended to limit the present application.

The concept of the present invention has been exemplified above with reference to a CR SAR ADC. Those skilled in the art will immediately understand that the present invention is not limited to a specific implementation of the ADC such as the exemplary CR SAR ADC. The basic concept of drawing a constant charge from the reference source is also applicable to any other ADC implementations, which draw a deterministic charge at each state transition from the reference source. The equalization, EQ, circuit of the present application is provided and configured to draw a state transition specific charge from the reference source such that the total charge drawn from the reference source at each state transition is constant. The equalization, EQ, circuit in particular comprises an array of capacitors. The EQ circuit represents a capacitive load to the reference source. The capacitive load of the EQ circuit is configurable to assume an effective capacitive load value out of a set of predefined capacitive load values. The predefined effective load values are predefined on design of the EQ circuit. The configuration of the effective capacitive load value of the EQ circuit is performed by individually and selectively switching one of more capacitors of the array of capacitors comprised by the EQ circuit. Each one of the set of predefined capacitive load values is assigned to at least one switching state and conversion phase cycle of the ADC, respectively.

Accordingly, a respective one of the predefined effective capacitive loads is selectively switched such that at a switching state transition of the ADC, at which the ADC draws a predefined charge from the reference source, a total charge $Q_{tot}$ is drawn from the reference source, which is at least equal to minimum total charge $Q_{min}$ or which is a predefined and constant charge $Q_{ref}$ independent from transitioning between switching states of the ADC; the total charge $Q_{tot}$ is drawn by the ADC and the EQ circuit.

Hence, the concept of the aforementioned EQ circuit is applicable with any DAC switching scheme and search algorithms as long as the effective capacitance change/charge drawn on state transition is deterministic. The equalization circuit is designed with respect to the deterministic effective capacitance change to allow for a constant charge drawn from the reference source. In particular, the EQ circuit is applicable with ADC comprising non-binary weighted capacitor arrays and redundancy implementations.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To illustrate clearly this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

The invention claimed is:

1. An equalization circuit, comprising:
   a configurable load section comprising a plurality of distinct effective loads, each effective load configured to be selectively connected to a reference voltage signal input of a reference source,
   a logic section arranged to accept a state signal from an analog-to-digital converter (ADC), connected to the reference source and to selectively connect one effective load out of the plurality of distinct effective loads in response to the state signal,
   wherein the state signal is indicative of an actual operation state of the ADC.

2. The equalization circuit according to claim 1, wherein a total load, which is experienced by the reference source and which comprises the one effective load of the equalization circuit and a load of the ADC, is equal to or greater than a predefined minimum load at least during at least one of a conversion phase and a sampling phase of the ADC.

3. The equalization circuit according to claim 1, wherein the one effective load is selected based on a function of the actual operation state of the ADC.

4. The equalization circuit according to claim 1, wherein the plurality of distinct effective loads comprises a plurality of distinct effective capacitive loads.

5. The equalization circuit according to claim 1, wherein the ADC is a charge redistribution successive approximation register ADC (CR SAR ADC) comprising an array of capacitors, wherein the state signal is indicative of a switching state of the array of capacitors.

6. The equalization circuit according to claim 5, wherein the CR SAR ADC draws a predefined charge from the reference source on transitioning from one switching state to a consecutive switching state.

7. The equalization circuit according to claim 1, wherein the configurable load section comprises an array of capacitors, which are selectively connectable to the reference voltage signal input to draw a predefined charge from the reference source, wherein the predefined charge is a function of the state signal.

8. The equalization circuit according to claim 1, wherein a total charge drawn by the ADC and the equalization circuit from the reference source is equal to or greater than a predefined minimum charge at least during a conversion phase, a sampling phase, or both of the ADC.

9. The equalization circuit according to claim 1, wherein a total charge drawn by the ADC and the equalization circuit from the reference source is constant and equal to a predefined reference charge at least during a conversion phase, a sampling phase, or both of the ADC.

10. The equalization circuit according to claim 1, wherein the ADC is configured to convert an analog input signal to a digital output signal in a predefined number of cycles including a predefined number of cycles in a sampling phase and a predefined number of cycles in a conversion phase.

11. The equalization circuit according to claim 10,
wherein a sequence of switching states of the ADC is deterministically determined by the analog input signal.

12. A system, comprising
an analog-to-digital converter, ADC; and
an equalization circuit comprising:
- a configurable load section comprising a plurality of distinct effective loads, each effective load configured to be selectively connected to a reference voltage signal input of a reference source,
- a logic section arranged to accept a state signal from the ADC connected to the reference source and to selectively connect one effective load out of the plurality of distinct effective loads in response to the state signal,
- wherein the state signal is indicative of an actual operation state of the ADC.

13. The system according to claim 12,
wherein the ADC is a charge redistribution successive approximation register ADC (CR SAR ADC) comprising an array of capacitors,
wherein the state signal is indicative of a switching state of the array of capacitors.

14. The system according to claim 12,
wherein the ADC is configured to convert an analog input signal to a digital output signal in a predefined number of cycles including a predefined number of cycles in a sampling phase and a predefined number of cycles in a conversion phase.

15. The system according to claim 14,
wherein a sequence of switching states of the ADC is deterministically determined by the analog input signal.

16. The system according to claim 12,
wherein the configurable load section comprises an array of capacitors, which are selectively connectable to the reference voltage signal input to draw a predefined charge from the reference source, wherein the predefined charge is a function of the state signal.

17. The system according to claim 12,
wherein a total load, which is experienced by the reference source and which comprises the one effective load of the equalization circuit and a load of the ADC, is equal to or greater than a predefined minimum load at least during at least one of a conversion phase and a sampling phase of the ADC.

18. The system according to claim 12,
wherein a total charge drawn by the ADC and the equalization circuit from the reference source is equal to or greater than a predefined minimum charge at least during a conversion phase, a sampling phase, or both of the ADC.

19. A method of operating an equalization circuit, said method comprising:
- providing a plurality of distinct effective loads, each effective load configured to be selectively connected to a reference voltage signal input of a reference source;
- accepting a state signal from an analog-to-digital converter, ADC, connected to the reference source; and
- selectively connecting one effective load out of the plurality of distinct effective loads in response to the state signal, wherein the state signal is indicative of an actual operation state of the ADC.

20. The method according to claim 19,
wherein the state signal is generated based on a function of the actual operation state of the ADC.

* * * * *